United States Patent
Wegmann

(10) Patent No.: US 7,283,204 B2
(45) Date of Patent: Oct. 16, 2007

(54) METHOD OF PRODUCING AN OPTICAL IMAGING SYSTEM

(75) Inventor: Ulrich Wegmann, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/731,011

(22) Filed: Dec. 10, 2003

(65) Prior Publication Data
US 2004/0169836 A1 Sep. 2, 2004

(30) Foreign Application Priority Data
Dec. 10, 2002 (DE) .............................. 102 58 715

(51) Int. Cl.
G03B 27/54 (2006.01)
G03B 27/32 (2006.01)

(52) U.S. Cl. .......................... 355/67; 355/77

(58) Field of Classification Search .............. 355/46, 355/52, 53, 55, 67, 77, 68, 71; 356/237, 356/521; 250/281, 307
See application file for complete search history.

(56) References Cited

U.S. PATENT DOCUMENTS

| | | | |
|---|---|---|---|
| 5,100,237 A | 3/1992 | Wittekoek et al. | |
| 5,392,119 A | 2/1995 | McArthur et al. | |
| 5,828,455 A | 10/1998 | Smith et al. | |
| 6,266,389 B1 | 7/2001 | Murayama et al. | |
| 6,268,903 B1 | 7/2001 | Chiba et al. | |
| 6,373,552 B1 | 4/2002 | Braat et al. | |
| 6,542,219 B2 | 4/2003 | Braat et al. | |
| 6,710,930 B2 | 3/2004 | Suzuki et al. | |
| 2002/0001088 A1 | 1/2002 | Wegmann et al. | |
| 2002/0126266 A1 | 9/2002 | Braat et al. | |
| 2002/0159040 A1 * | 10/2002 | Hamatani et al. ............. | 355/52 |
| 2003/0011894 A1 * | 1/2003 | Schuster ..................... | 359/731 |
| 2004/0013956 A1 * | 1/2004 | Sogard ........................ | 430/30 |
| 2004/0027549 A1 * | 2/2004 | Nagayama ................... | 355/55 |

(Continued)

FOREIGN PATENT DOCUMENTS

DE 101 09 929 11/2001

(Continued)

OTHER PUBLICATIONS

C. Hofmann, et al "Nanometer-Asphaeren", Feinwerktechnik & Messtechnik 99 (1991) vol. 10 Carl Hanser Verlag, Munich Germany, pp. 437-440.

*Primary Examiner*—Rodney Fuller
*Assistant Examiner*—Kevin Gutierrez
(74) *Attorney, Agent, or Firm*—Sughrue Mion, PLLC

(57) ABSTRACT

A method of producing an optical imaging system having a plurality of optical elements after the imaging system is initially assembled and adjusted. During a subsequent measurement of the imaging system, the wavefront errors in the exit pupil, or an area conjugate therewith, belonging to the imaging system are determined in a spatially resolving manner. The optical element which has the correction surface is held in a separate mount and, following the measurement, is removed together with the mount. On the basis of the measurement, a topography and/or refractive index distribution of the correction surface which is required to compensate for the wavefront errors determined during the measurement is calculated. Following subsequent coating of the correction surface in the mount, the processed optical element is installed again in its installed position in the imaging system.

30 Claims, 2 Drawing Sheets

U.S. PATENT DOCUMENTS

| | | | |
|---|---|---|---|
| 2004/0032579 A1* | 2/2004 | Emer et al. ................... | 356/72 |
| 2004/0042094 A1 | 3/2004 | Matsuyama | |
| 2005/0007603 A1* | 1/2005 | Arieli et al. ................ | 356/601 |

FOREIGN PATENT DOCUMENTS

| | | |
|---|---|---|
| DE | 101 23 725 A1 | 11/2002 |
| EP | 0 393 775 A1 | 10/1990 |
| EP | 1 022 617 A2 | 7/2000 |
| EP | 0 724 199 B1 | 7/2001 |
| JP | 10-154657 A | 6/1998 |
| JP | 2000-249917 A | 9/2000 |
| WO | WO96/07075 A1 | 3/1996 |
| WO | 02/054459 A1 | 7/2002 |

* cited by examiner

METHOD OF PRODUCING AN OPTICAL IMAGING SYSTEM

The following disclosure is based on German Patent Application No. 102 58 715.9 filed on Dec. 10, 2002, which is incorporated into this application by reference.

BACKGROUND OF THE INVENTION

1. Field of the Invention

The invention relates to a method of producing an optical imaging system, in particular a microlithographic projection objective, which has a plurality of optical elements, and to an optical imaging system produced with the aid of the method.

2. Description of the Related Art

In optical imaging systems which have a plurality of optical elements, the total imaging errors result from the sum of the errors of the individual optical elements contributing to the imaging. Since error tolerances for individual components cannot be reduced arbitrarily, as a rule, fine adjustment of the overall system is required in order to minimize the total error of the system. Such an adjustment process is very complicated, for example in high-performance projection objectives for microlithography. The projection objectives of this type, which not infrequently include more than ten or twenty optical elements, are used, as is known, in projection exposure installations for the production of semiconductor components and other finely structured components and serve to project patterns of photo masks or graduated plates (masks, reticles) at high resolution on a reducing scale onto an object coated with a light-sensitive layer. The required imaging performance with resolutions in the submicron range simply cannot be achieved in these complex systems without complicated adjustment.

A fine adjustment process generally includes a plurality of different manipulations on lenses or other optical elements. This includes lateral displacements of the elements at right angles to the optical axis (designated centering here), displacements of elements along the optical axis for the purpose of changing air spacings (designated tuning here) and/or rotations of elements about the optical axis (designated compensation here). Tilting of individual elements may possibly also be provided. The adjustment procedure is carried out under the control of a suitable aberration measurement of the imaging system, in order to check the effects of the manipulations and to be able to derive instructions for further adjustment steps.

Even after complicated adjustment, residual errors may remain, which can either be eliminated only with considerably increased adjustment effort or not at all by means of adjustment. If the errors exceed the specifications predefined for the optical system, further measures are needed in order to improve the imaging performance. One measure is the introduction of what are known as "correction aspheres" into the optical imaging system. In this way, residual errors which may possibly be present can be minimized further. A "correction asphere" in the sense of this application is an aspherically curved surface of a lens or of a mirror whose surface shape is specifically used to compensate partially or wholly for fabrication errors of an optical system. In this sense, correction aspheres must be distinguished from what are known as "design aspheres", whose surface shape is defined in the context of the original optical design. Correction aspheres with a deformation between about 10 nm and about 1 μm, which are also designated nanoaspheres or nanometer aspheres are normally used. The use of such aspheres for correction purposes in diffraction-limited high-performance optics is described, for example, in the article "Nanometer-Aspharen: Wie herstellen und wofür?" ["Nanometer Aspheres: How to Manufacture and for What Applications"] by C. Hofman, A. Leitel, K. Merkel, B. Retschke, Feinwerktechnik und Messtechnik 99 (1991) 10, pages 437 to 440.

In U.S. Pat. No. 6,268,903 B1 (corresponding to EP 724 199 B1), an adjustment method for an optical imaging method is described, for which a correction element is fabricated on the basis of a distortion measurement. For this purpose, a correction element, which is part of the projection objective, is provided at a predetermined location in the imaging system. Following a measurement of the distortion of the system, the topography of the surface of the correction element which is required in order to eliminate the corresponding distortion component is calculated. Then, the correction element is removed from the projection system and the correction surface is processed. The correction element is then inserted again. The projection system has an objective part in front of its aperture stop plane and an objective part after this aperture stop plane. The intention is installation positions which are located as far as possible from the aperture stop plane and very close to the object or image. With this, the intention is for the spot size of the small bundle of radiation on the correction surface to be very small, and therefore for the influence on other aberrations to be slight. The installation positions close to the field are also intended to simplify the removal and installation of the correction element. The measurement method used for the distortion is an indirect method, in which a test reticle is imaged onto a wafer coated with photoresist, the exposed wafer is then developed and the imaged pattern is measured with the aid of a coordinate measuring machine.

U.S. Pat. No. 5,392,119 (cf. also WO 96/07075) describes a method for correcting aberrations of an optical imaging system in which at least one imaging error, for example distortion, imaging field curvature, spherical aberration, coma or astigmatism, is measured on the imaging system. On the basis of the measurements, correction plates matched individually for the imaging system are fabricated, their correction surfaces being used to minimize the measured imaging errors. In this way, "spectacles" can subsequently be fitted to an imaging system. As a result, the imaging performance of existing imaging systems can be improved. In one exemplary embodiment, two correction plates are arranged outside the projection objective, between object plane and objective, and one plate in the region of the aperture stop plane. The measuring technique used for determining the imaging errors is a variant of the Hartmann method. In this case, the wavefront errors produced by the imaging system are converted into lateral deviations of the actual image points from the positions of ideal image points which would be achievable with an error-free imaging system. If the measurement is carried out for a plurality of field points, then the deformation of the wavefront in the pupil of the imaging system can be reconstructed on the basis of a model from the field of the resultant deviation vectors. A description of an appropriate measuring technique will be found, for example, in U.S. Pat. No. 5,828,455.

European Patent Application EP 1 022 617 describes a microlithography projection objective in which the last optical element provided in front of the image plane is a correction plate of constant thickness, whose two surfaces have an identical aspherical shape. The shape of the aspheres was determined on the basis of a distortion measurement of the objective.

Japanese Patent Application JP 10-154 657 describes a production process for a microlithography projection objective, in which the lenses of the objective are displaced axially, decentered and/or tilted with respect to one another in order to minimize aberrations, and in which a correction asphere is produced on an optical surface in order to correct aberrations of higher order.

SUMMARY OF THE INVENTION

One object of the invention is to provide a method of producing an optical imaging system which makes it possible to create optical imaging systems of complex construction with an excellent state of correction with a tolerable expenditure.

As a solution to this and other objects, this invention, according to one formulation, provides a method of producing an optical imaging system, which has a large number of optical elements, including:

assembling the imaging system with the optical elements substantially arranged in the correct position;

measuring the imaging system with locally resolving determination of the wavefront in the exit pupil or an surface conjugate therewith belonging to the imaging system, for the locally resolving determination of wavefront errors;

selecting at least one surface provided as a correction surface on at least one of the optical elements, the correction surface being chosen such that it is arranged in the surface of the exit pupil or a surface conjugate therewith belonging to the imaging system;

calculating at least one of a topography and a refractive index distribution of at least one surface provided as a correction surface belonging to an optical element, in order to correct the wavefront error;

removing the at least one optical element provided with a correction surface from the imaging system;

locally resolving processing of the at least one correction surface, in order to produce at least one of the calculated topography and refractive index distribution of the correction surface; and installing the optical element having the processed correction surface in the correct position in the imaging system.

Advantageous embodiments are specified in the dependent claims. The wording of all the claims is made part of the content of the description by reference.

In the method according to the invention, the imaging system is firstly assembled with the optical elements arranged substantially in the correct position. In this case, each optical element can have a separate mount. As a rule, the assembly is followed by an adjustment process, in order to optimize the imaging performance of the imaging system. Here, individual lenses or other optical elements can be displaced axially and/or transversely with respect to the optical axis, tilted and/or rotated in the manner mentioned at the beginning. A measurement of the imaging system for the spatially (locally) resolving determination of the wavefront in the exit pupil or an area conjugate therewith belonging to the imaging system is used for the spatially resolving determination of wavefront errors. A surface provided as a correction surface is selected on at least one of the optical elements. This at least one correction surface must be chosen such that it is arranged in the area of the exit pupil or in an area conjugate therewith belonging to the imaging system. The correction surface should therefore lie in the exit pupil (or an area conjugate therewith) or in the vicinity of this area. The at least one optical element on which the at least one correction surface is formed is in this case an element belonging to the original design of the imaging system.

On the basis of the aforementioned measurement of wavefront errors, a topography or a shape of a correction surface and/or a refractive index distribution on the correction surface is calculated which is required to reduce the wavefront errors determined during the measurement, that is to say to compensate for them partially or largely completely. The calculation can be carried out, for example, by means of ray tracing or using sensitivity tables. Once the measurement has been concluded, the optical element which has the correction surface can be removed from the imaging system. For this purpose, the latter can be divided at a suitable location. Following the removal, spatially resolving processing of the correction surface is carried out in order to produce the topography and/or on the refractive index distribution, a shape correction and/or a local refractive index change having to be carried out with the correct coordinates in accordance with the results from the topography calculation. Once the shaping of the correction surface and/or and the change in the refractive index distribution has been completed, the optical element which contains the finally processed correction surface is again installed in the correct position at its position in the imaging system. The correction surface is then again located in the area of the exit pupil or an area conjugate therewith and can excert its effect here.

One aspect of the invention is therefore substantially directed to minimizing the pupil error by correcting the optical effect at one or more surfaces of an objective. As is known, all the wavefronts of an image run through the pupil of an objective, irrespective of their starting point in the object field. This means, firstly, that lens errors in the vicinity of the pupil are impressed in a comparable way on all the wavefronts. They thus leave their fingerprints behind on all the wavefronts and therefore—apart from accidental local compensations—damage the image at every field point in a comparable way. The invention makes use of this circumstance, in that the pupil area or an area optically conjugate therewith is selected as the location for a correction.

The possibility of subsequent wavefront correction in the vicinity of the pupil can be used for considerable simplification and shortening of the adjustment process. It is generally true that image error types with two axes of symmetry, such as anamorphotic distortion (anamorphism) and astigmatism on the axis (axial astigmatism, AIDA) are attributable to non-rotationally symmetrical lens errors, for example to saddle passes or to bending of the refractive surfaces as a result of external forces. This also applies to error types with a plurality of axes of symmetry. In imaging systems, such errors can be compensated for by rotating individual lenses about their optical axes only if suitable "partners" with corresponding effects can be found which can be used for compensation. Such a search for partners is very time-consuming and not always successful. The effects of such lens errors depend on the type of the error and on the location of the surfaces in the system causing the error. In general, non-rotationally symmetrical lens errors have a greater effect on distortion in the vicinity of a field plane, for example close to the object or image, while, if the defective surfaces are located close to the pupil, they are impressed on all the wavefronts (for example AIDA, trefoil errors or the like). In the event of arrangement in the spaces lying in between, the aforementioned error types are present with different weightings. These circumstances cause the joint compensation of the two error types to become very complex. As a rule, errors with more than two axes of symmetry cannot be compensated for completely. The compensation of anamorphotic distortion or anamorphism and AIDA is as a rule by far the most time-consuming part of an adjustment process. In addition, rotationally symmetrical errors of higher order cannot be eliminated or cannot be eliminated adequately by adjustment and can be corrected according to the invention. Even linear combinations of aberrations can be corrected.

In the event that a correction in the vicinity of the pupil is used, it is possible to dispense with simultaneous compensation of anamorphism and axial astigmatism. Instead, the adjustment process can be restricted to compensating for the anamorphism. Therefore, in many cases, more than half the adjustment effort required can be omitted, so that a considerable simplification of the adjustment can be achieved, with a considerable shortening of the adjustment time. At the same time, as a result of the subsequent correction of one or more surfaces close to the pupil, the result is a considerable improvement in the imaging performance. In addition, corrections in the area close to the pupil lead to the imaging performance not varying or varying only slightly with different illumination settings. Subsequent correction in the area of a pupil surface of the objective can also contribute to relaxing the tolerances for optical components to be used close to the pupil, so that here more cost-effective qualities may possibly be used.

Here, areas close to the pupil should be understood in particular to be those axial sections of an imaging system in which the marginal beam heights, that is to say the beam heights of marginal beams of the optical images, lie in the vicinity of the radius of the opening of the system aperture stop. For example, areas in which a ratio between the marginal beam height and the radius of the system aperture lies between about 0.8 and about 1.0 are beneficial.

Any suitable method can be used for measuring the imaging system for the spatially resolving determination of wavefront errors, in particular suitable interferometric methods which permit direct determination of light path deviations via the exit pupil. For example, Twyman-Green methods or methods with a Fizeau structure or Mach-Zehnder structure can be used. Preference is given to methods which permit direct measurement of the wavefront aberration in the exit pupil for many field points at the same time. Such a method, which operates on the shearing interferometry principle, is described in German Patent Application DE 101 09 929 A1, whose disclosure content in this regard is incorporated in this description by reference. It is also possible for many field points to be measured one after another. For example, the measurement of wavefront errors can be carried out for between about 10 and about 100 field points.

The correction surface can be a substantially flat surface, for example on a transparent plate, or a slightly or highly curved surface of a lens or of a mirror. A suitable plate-like element is, for example, a plate, arranged close to the pupil, of an alignment system (cf., for example, European Reference EP 393 775, FIGS. 4 to 6).

Within the scope of the invention, different optimization targets are possible in the calculation of the topography and/or the refractive index distribution of the correction surface. In one embodiment, the wavefront error is initially determined for a plurality of field points. This is then followed by correct-coordinate averaging of the wavefront errors in order to determine an average wavefront error for a surface close to the pupil. Averaging can be carried out over the contributions of the individual wavefronts of many field points and/or over individual wavefronts per se. The calculation of the topography and/or of the refractive index distribution is then carried out in such a way that this average wavefront error is compensated for partially or completely by the shape of the correction surface and/or its refractive index distribution. In this way, in particular an improvement of the imaging performance can be achieved by correcting the average pupil error, in particular axial astigmatism (AIDA), trefoil error, quatrefoil error, spherical aberration (including that of higher order). In this case, the determination of an unweighted average may be sufficient, it being possible, for example, to use the arithmetic mean over all the wavefronts from the measured field as the average pupil error. Depending on the optimization target, a weighted average can also be determined, for example. If a specification for an imaging system is laid out such that a maximum value for a specific image error must not be exceeded, then the correction can also be applied such that the worst value of the wavefront error does not exceed this limiting value over the field.

When selecting the optimization targets, a distinction can be drawn between requirements on the field distribution of criteria and the criteria on the individual wavefront itself. Firstly, the magnitude to be optimized at the individual wavefront (wavefront at a single field point) must be named. This depends, as a rule, on the application of the objective and results from the objective specifications. Normally, a plurality of conditions has to be met, including combinations of individual conditions.

Specifications or characteristic variables can be variables derived from the wavefront, for example: "maximum permissible RMS value" (corresponds to the contrast, RMS=root mean square, that is to say the square root of the average squared deviation, the ideal value is zero here). Further characteristic variables are, for example, individual Zernike coefficients or linear combinations of Zernike coefficients (for example rotationally symmetrical and rotationally asymmetrical). For example, for the lithography-relevant variable "isofocal tilt" there is the linear combination of the spherical aberrations=magnitude of Z9+magnitude of Z16+magnitude of Z25. There may be residual wavefront errors following the filtering of spatial frequencies (for example following the subtraction of lower orders or variables which can be corrected in other ways). It is also possible for the wavefront itself to be processed further, therefore in a spatially resolved manner (pixel by pixel), as raw data or after local filtering.

By using these coexisting variables, optimization targets for the courses in the field can then be generated; for example arithmetic mean (one of the above-mentioned variables), weighted mean, quadratic mean, worst field point, linear combination of the criteria, mixture of characteristic variables calculated pixel by pixel and derived characteristic variables. In the case of lithography optics, the criteria generally originate from the lithography process itself and, since both the process and the understanding of the action of aberrations on the process are developing continually, the criteria also change.

The optical surfaces of the optical elements of the imaging systems treated here are generally coated with antireflection coatings (in the case of lenses or prisms) or with reflective coatings (in the case of mirrors), in order to achieve an optimum imaging performance of the overall system. In one development of the method, at least the surface provided as the correction surface remains uncoated and is installed in the uncoated state. Accordingly, the optical imaging system is also measured with at least one uncoated surface. Coating of the finished correction surface, which is preferably provided, is then performed after the spatially resolving processing. In the case of this variant, it is beneficial if the effect of the coating provided for the correction surface, for example an antireflection coating, is taken into account in the calculation of the wavefront error and the subsequent calculation of the topography and/or in the refractive index distribution of the correction surface, by means of an appropriate allowance. This is at least approximately possible, since the effect of the coating provided for the correction surface, in particular on the phase of the wavefront passing through, can be derived approximately from the layer design and can be included in the model calculation of the lens arrangement. If appropriate, the coating itself can be used as a corrective medium.

Although, for the processing, it is possible to release from its mount the at least one optical element provided for the fitting of the correction surface, in a preferred development provision is made to mount at least this element in a separate mount and to remove it with the mount. In addition, the subsequent surface processing for producing the correction surface and/or for changing the refractive index distribution and/or subsequent coating of the finished correction surface can be carried out without the optical element having to be removed from its mount. The optical element optimized in this way can then be installed again at the appropriate installation position in the imaging system together with its mount and fixed. With this method variant, some operations, specifically releasing an optical element from its mount and subsequently inserting it into the mount, as far as possible in the correct position, can thus be saved. In addition, the errors associated with such operations are thereby avoided, which means, in particular, that inserting the optimized correction topography at the correct coordinates is made easier.

The spatially (locally) resolving processing of the correction surface can include material removal at the correct coordinates, for example by ion etching, and/or material application at the correct position, for example by means of coating. Alternatively or additionally, a local change in the refractive index of the correction surface can be provided, for example by doping with foreign atoms, in order to change the spatial refractive index distribution at the correction surface. Use is expediently made of computer-numeric control, in which the material removal and/or the material application and/or the local refractive index change can be carried out accurately on the basis of the spatially resolving measurement of the wavefront errors.

In the case of the method variant with the coating of the mounted optical elements, coating techniques are preferred which operate at moderate temperatures, in order to avoid temperature-induced changes of the mounting geometry and/or temperature-induced separation of a lens, for example an adhesively bonded lens, from its mount. If necessary, adhesive layers can be protected against heating by cooling the mount.

The invention also relates to an optical imaging system, in particular a microlithographic projection objective, which is produced or can be produced by the method according to the invention. Such a system is distinguished in particular by the fact that, at at least one surface close to the pupil of an optical elements, for example at an entry surface or an exit surface of a lens close to the pupil, a normally aspherical correction surface is provided, whose shape and/or refractive index distribution deviate significantly from the surface shape and/or refractive index distribution of the corresponding interface in the basic optical design. The amount of the deviation from the shape to be viewed as the reference shape according to the optical design can be locally, for example, of the order of magnitude of between about 10 nm and about 1 μm.

The above and further features also emerge from the description and the drawings, in addition to from the claims, the individual features in each case being implemented on their own or in a plurality in the form of sub-combinations in an embodiment of the invention and in other fields and being able to represent implementations which are advantageous and inherently capable of protection. Exemplary embodiments of the invention are illustrated in the drawings and will be explained in more detail in the following text.

DETAILED DESCRIPTION OF THE PREFERRED EMBODIMENTS

Figure 1A:
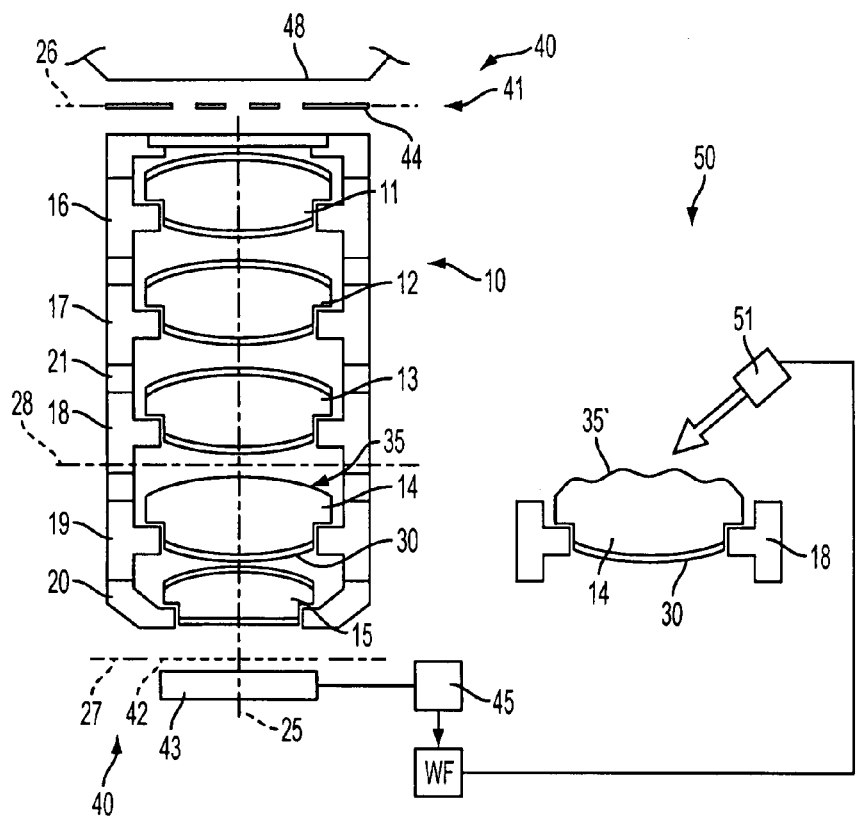
FIGS. 1A and 1B are a schematic representation to explain an embodiment of a method according to the invention for producing a microlithography projection objective.
Figure 1B:
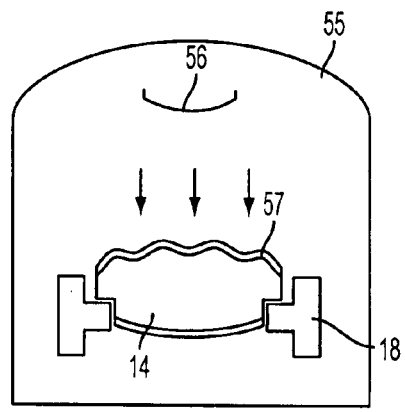

FIG. 1 shows one embodiment of a production process according to the invention with which an optical imaging system is produced in the form of a projection objective 10 for microlithography. This is a rotationally symmetrical, purely refractive reduction objective with a reduction factor of 4:1, which is designed for an operating wavelength in the deep ultraviolet range, for example for 157 nm, 193 nm or 248 nm. The projection objective includes a plurality of, for example, between fifteen and thirty lenses, of which only some lenses 11 to 15 are shown, by way of example. Each of the lenses is mounted individually in a separate mount 16 to 20 and firmly connected to the associated mounting element by adhesive bonding in the edge region of the lens. The mounting elements are to some extent arranged directly above one another and connected to one another. Between individual or all the mounting elements, separate spacer rings 21 can also be inserted, which are used for precise setting of the axial lens spacings (air spacings). If, during the assembly of the projection objective, the mounts are connected to each other by screwing, for example, the lenses of the system are already largely centered along the optical axis 25 of the imaging system with the correct air spacings located in between.

The projection objective 10 is designed for the purpose of imaging a pattern of a mask or a reticle, arranged in its object plane 26, into the image plane 27 on a reduced scale without an intermediate image. Between the object plane and the image plane there is the single pupil plane 28 of the system, which is a Fourier-transformed plane in relation to object plane and image plane. In other projection objectives, for example in catadioptric projection objectives with geometrical or physical beam splitting and at least one concave mirror, at least one real intermediate image can be produced during the imaging. In this case, there is a plurality of pupil planes, which are in each case located between the field planes (object plane, intermediate image plane, image plane) and are optically conjugate with one another. The areas of the pupil planes are preferred locations for the fitting of a system aperture stop for limiting the beam diameter and for the optional setting of the numerical aperture used for the respective imaging.

In the projection objective 10, with one exception, all the entry surfaces and exit surfaces of the lenses are provided with antireflection coatings, in order to minimize the light losses in the system and to ensure adequate transmission of the overall system. In the case of the lens 14 which is closest to the pupil and which, in the light propagation direction, is situated immediately behind the pupil plane 28, only the exit side facing away from the pupil plane is provided with an antireflection coating 30. By contrast, the entry surface 35 located in the immediate vicinity of the pupil plane is uncoated. It is provided as the correction surface of the system.

All the entry surfaces and exit surfaces of the lenses are shaped in accordance with the original design of the projection objective. In the example, the entry surface 35 of the lens 14 nearest to the pupil is curved spherically, but it can also be an aspherical surface which, in this case, is designated a design asphere, since the asphericity is provided within the context of the optical design in order to contribute to the correction of specific image errors of the system. The surface closest to the pupil can also be substantially flat.

The assembled projection objective 10 is installed in an interferometric measuring apparatus 40 (see FIG. 1A) for the acquisition (detection) of wavefronts. The measuring apparatus uses the light from an illumination system 48 and includes a wavefront source 41 arranged on the object side of the projection objective for producing wavefronts which run through the objective, a diffraction grating 42 arranged in the image plane of the projection objective, and a spatially resolving detector 43 which is arranged downstream of the diffraction grating and which is connected to an evaluation unit 45. In the embodiment, the wavefront source 41 includes a perforated mask 44 arranged in the object plane 26 and having a plurality of periodically arranged openings, whose minimum diameter is in each case considerably larger than the operating wavelength used (for example 193 nm or 248 nm). As a result, the wavefront source has a two-dimensional structure, which can be used to adapt the spatial coherence of the radiation in such a way that a highly accurate wavefront measurement is possible. After the wavefront emerging from the perforated mask 44, which is composed of a plurality of spherical waves, has passed through the imaging system 10, it strikes the diffraction grating 42, which is designed in such a way that only the zeroth diffraction order and the first diffraction orders interfere and contribute to the intensity distribution picked up by the detector 43. As a result, in this shearing interferometer various locations of the exit pupil 28 of the imaging system are compared with one another interferometrically. From this comparison, wavefront aberrations can be derived as a function of the location of the exit pupil. In this case, the interferometer measures the shape of the wavefront in a spatially resolved manner directly by using the phases of the waves in the exit pupil. Aberrations, that is to say deviations from a perfect spherical wave, can then be determined from the wavefront.

In order to obtain information about the course of possible aberrations in the image field, the measuring apparatus is of multichannel design, so that it is possible to measure simultaneously at many field points. In the case of a multichannel measurement, for example, between about ten and about one thousand channels can be used simultaneously, corresponding to the number of holes in the perforated mask. Details relating to the measuring method used in this embodiment and the corresponding measuring apparatus can be taken from DE 101 09 929, whose disclosure content is made the content of this description by reference.

Figure 2:
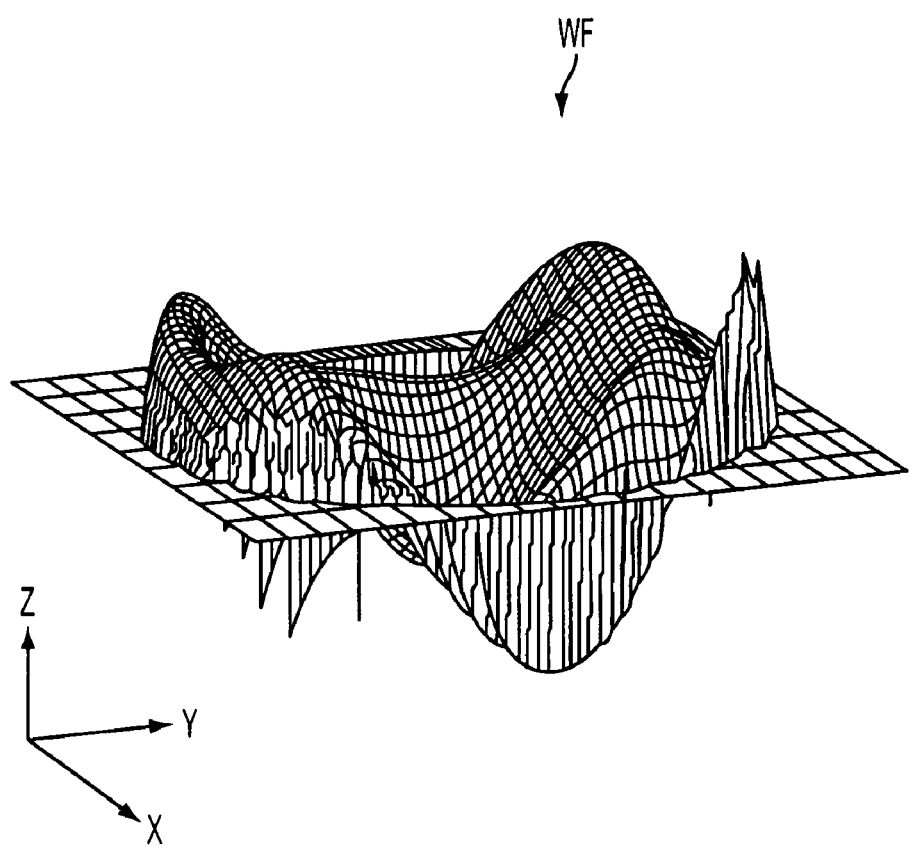
FIG. 2 is a graph which shows the result of a spatially resolved, direct wavefront measurement in one implementation of the invention.

FIG. 2 shows, by way of example, a quasi three-dimensional representation of the result of a spatially resolved wavefront measurement with the aid of the aforementioned shearing interferometer. Indicated in the x-y plane are location coordinates of the exit pupil 28 of the projection objective, and the wavefront aberrations are plotted in arbitrary length units in the z direction running parallel to the optical axis. An analysis of the wavefront WF yields the result that astigmatism, coma, spherical aberration and quatrefoil error contribute as dominant image errors to the deformation of the wavefront.

In the production of the finished, corrected projection objective, the procedure can be as follows, for example. Firstly, as described, the object is assembled from the individually mounted lenses, an element 14 close to the pupil initially remaining uncoated on the correction surface 35 provided for correction. The other lens surfaces are antireflection coated. The objective is then installed in the measuring apparatus 40, with which the adjustment operation is monitored. During the adjustment, the objective 10 is initially tuned in the conventional manner, for example the anamorphism being eliminated or at least minimized by rotating lenses. During this adjustment, however, no particular weight is placed on the compensation of the axial astigmatism (AIDA). As a result, the expenditure on time during the adjustment can be reduced considerably as compared with conventional procedures. The measuring apparatus 40 (e.g., an interferometer) is used to observe the effects of the adjustment actions on the wavefront.

Once the adjustment has been concluded, a complete interferometric measurement of the objective 10 at many field points is carried out, preferably simultaneously at many field points. Then, in the evaluation unit 45, correct-coordinate averaging of the wavefronts is carried out, which results in an average pupil error, for example in the manner described above.

On the basis of the average pupil error, a calculation of the topography of the correction surface 35 is made. The aim of this calculation is the determination of that surface shape of the correction surface 35 which is necessary to compensate for the average pupil error determined. In this case, the calculation is carried out in such a way that the shape changes to be made on the correction surface 35 can be made by means of a local material removal in the area of the correction surface. It is also possible to configure the calculation in such a way that the shape change of the surface may contain both local material removal and also local material application or only local material application.

In order to process the correction surface, the objective 10 is then divided in the vicinity of the pupil 28, in order to be able to remove the lens 14 held in the mount 19 together with the mount. The lens is then installed with its mount in an ion-beam etching system 50, illustrated symbolically in FIG. 1A, in such a way that the correction surface to be processed faces an ion-beam source 51. With the aid of the ion-beam source, correct-coordinate processing of the correction surface is carried out, the ion-beam source being controlled on the basis of the data which has resulted from the multichannel measurement of the wavefront WF of the still uncorrected system. As a rule, the shape corrections will be slight and deviations from the original shape will not exceed more than 1 μm or do so only in exceptional cases. Therefore, in the normal case, a correction nanoasphere will be produced as the correction surface. However, correction surfaces with coarser structures are also possible within the scope of the invention. The surface shape achieved by the surface processing can be checked interferometrically or in another way.

In the next method step, the finally polished and checked correction surface 35' is coated with an optically active layer which, in the example, is an antireflection coating. For this purpose, the lens 14 with its mount is installed in a vacuum chamber 55 (see FIG. 1B) of a coating installation in such a way that the correction surface 35' to be coated faces the material source 56 for the coating material. The antireflection coating 57, which can consist of a plurality of dielectric layers of alternately highly refractive and low-refraction material, is preferably applied at low temperatures considerably below 30°, in order to avoid thermal stressing of the mount 18 and of the adhesive bonding points between mount and lens 13.

Following the coating of the correction surface, the mount with the lens held in it is again installed at the envisaged position in the projection objective. Since the mutually adjacent mounts are designed, by means of parts which interengage with a form fit or in another way, such that the mount 18 can be installed again in exactly the position in which it was during the final interferometric measurement of the still uncorrected objective, the coated correction surface 35' is located exactly in the position close to the pupil in which the still unprocessed surface 35 was located before being removed from the objective. Therefore, correct-coordinate correction of wavefront errors is ensured with the aid of the correction surface 35'. In the example, the correction surface is configured in such a way that the axial astigmatism still remaining after the adjustment is largely or completely compensated for by the correction surface 35'.

In an exemplary embodiment not illustrated pictorially, the transparent optical element closest to the pupil was a substantially plane-parallel plate whose entry surface was located in the vicinity of the pupil plane of the projection objective. In the system, this plate serves as a carrier for further optical elements of an alignment system. After the adjustment of the system was optimized to the avoidance of anamorphotic distortion, a remaining axial astigmatism (AIDA) of 30 nm (before the introduction of the correction surface) could be reduced to about 3.5 nm following the production and installation of the correction surface.

Within the scope of the invention, it is also possible to compensate for the necessary correction derived from the result of the wavefront measurement with the aid of two or more correction surfaces suitably coordinated with one another. The correction surface used can also be, for example, a mirror surface arranged in the vicinity of the pupil. Such mirror surfaces close to the pupil can exist, for example, in catadioptric projection objectives with an intermediate image, in which the imaging coricave mirror is frequently located in the region of a pupil surface. If, for example, use is made of a dielectrically reinforced mirror with a reflective metal layer, for example of aluminum, and a dielectric layer lying above this, then, for example, the metal layer can initially remained uncoated. The correction topography can then be produced on the metal layer via material removal and/or material application, before the dielectric reinforcing layer is finally applied.

The above description of the preferred embodiments has been given by way of example. From the disclosure given, those skilled in the art will not only understand the prensent invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A method of producing an optical imaging system, which has a plurality of optical elements, comprising:
   assembling the imaging system with the optical elements substantially arranged in predefined positions;
   measuring the imaging system with locally resolving determination of the wave-front in the exit pupil or an surface conjugate therewith belonging to the imaging system, for the locally resolving determination of wavefront errors;
   selecting at least one surface provided as a correction surface on at least one of the optical elements, the correction surface being selected such that the correction surface is arranged in the surface of the exit pupil or a surface conjugate therewith belonging to the imaging system;
   calculating at least one of a topography and a refractive index distribution of the at least one surface selected as the correction surface belonging to the optical element, in order to correct the wavefront error;
   removing the at least one optical element provided with the correction surface from the imaging system;
   locally resolving processing of the at least one correction surface, in order to produce at least one of the calculated topography and refractive index distribution of the correction surface; and
   installing the optical element having the processed correction surface in the predefined position for the optical element in the imaging system.

2. The method according to claim 1, wherein the measurement of the imaging system is an interferometric measurement, which permits immediate determination of light path deviations via the exit pupil or a surface conjugate therewith belonging to the imaging system.

3. The method according to claim 1, wherein the measurement of the wavefront errors is carried out simultaneously for a plurality of field points.

4. The method according to claim 3, wherein the measurement of the wavefront errors is carried out for between about 10 and about 100 field points.

5. The method according to claim 1, wherein the measurement of the wavefront errors is carried out successively for a plurality of field points.

6. The method according to claim 5, wherein the measurement of the wavefront errors is carried out for between about 10 and about 100 field points.

7. The method according to claim 1, wherein a shearing interferometer with a two-dimensional wavefront source is used for the measurement.

8. The method according to claim 1, further comprising:
   correct-coordinate averaging of the wavefront errors determined during the measurement in order to determine an average wavefront error; and
   calculating at least one of a topography and a refractive index distribution of the correction surface such that the average wavefront error is least partly compensated.

9. The method according to claim 1, wherein a weighted average of wavefront errors is calculated and the calculation of at least one of a topography and a refractive index distribution of the correction surface is carried out such that the weighted average wavefront error can be compensated for by the correction surface.

10. The method according to claims 1, wherein a maximum value of the wavefront error and an associated location on the exit pupil or an surface conjugate therewith is determined, and wherein the calculation of at least one of a topography and a refractive index distribution of the correction surface is carried out in such a way that the maximum value is reduced to a predefined limiting value or below that value.

11. The method according to claim 1, wherein, during an assembly of the optical imaging system, at least the at least one surface provided as a correction surface remains uncoated, and the optical imaging system with the at least one uncoated surface is measured.

12. The method according to claim 11, wherein an effect of a coating provided for the correction surface is taken into account in the calculation of the wavefront error and a subsequent calculation of at least one of a topography and a refractive index distribution of the correction surface.

13. The method according to claim 1, further comprising:
mounting the optical, element having the correction surface in a separate mount;
removing the optical element with the mount;
further processing the correction surface of the optical element held in the mount;
installing the optical element held in the mount in the imaging system.

14. The method according to claim 13, wherein the further processing of the correction surface includes at least one of correct-coordinate shaping the correction surface and locally changing the refractive index of the correction surface on the basis of data from the wavefront measurement.

15. The method according to claim 14, wherein the shaping of the correction surface is carried out by ion-beam etching.

16. The method according to claim 14, wherein the locally changing the refractive index is carried out by doping with foreign atoms.

17. The method according to claim 13, wherein the further processing of the correction surface includes coating the finally processed correction surface with an optically active layer.

18. The method according to claim 17, wherein the optically active layer is an antireflection layer.

19. The method according to claim 17, wherein the coating is carried out at maximum temperatures of the optical element of less than about 30° C.

20. The method according to claim 13, wherein the further processing includes a locally resolving processing comprising deposition of material on an uncoated surface in order to produce the topography of the correction surface.

21. The method according to claim 13, wherein the further processing includes a locally resolving processing comprising locally resolving doping of the optical element provided with the correction surface in order to produce local refractive index variations.

22. The method according to claim 1, wherein the optical imaging system is a microlithographic projection objective.

23. A method of producing an optical imaging system, which has a plurality of optical elements, comprising:
assembling the imaging system with the optical elements substantially arranged in predetermined positions;
measuring the imaging system with locally resolving determination of the wave-front in the exit pupil or a surface conjugate therewith belonging to the imaging system, for the locally resolving determination of wavefront errors;
selecting at least one surface provided as a correction surface on at least one of the optical elements, the correction surface being selected such that the correction surface is arranged in the surface of the exit pupil or a surface conjugate therewith belonging to the imaging system;
calculating at least one of a topography and a refractive index distribution of at least one surface provided as the correction surface belonging to the optical element, in order to correct the wavefront error;
removing the at least one optical element provided with the correction surface from the imaging system;
locally resolving processing of the at least one correction surface, in order to produce at least one of the calculated topography and the refractive index distribution of the correction surface; and
installing the optical element having the processed correction surface in the predetermined position for the optical element in the imaging system,
wherein the locally resolving processing includes at least one of correct-coordinate shaping of the correction surface and locally changing the refractive index of the correction surface on the basis of data from the wavefront measurement.

24. A method of producing an optical imaging system, which has a plurality of optical elements, comprising:
assembling the imaging system with the optical elements substantially arranged in predefined positions;
measuring the imaging system with locally resolving determination of the wave-front in the exit pupil or a surface conjugate therewith belonging to the imaging system, for the locally resolving determination of wavefront errors;
wherein the measurement of the wavefront errors is carried out simultaneously for a plurality of field points using a shearing interferometer with a two-dimensional wavefront source;
selecting at least one surface provided as a correction surface on at least one of the optical elements, the correction surface being selected such that the correction surface is arranged in the surface of the exit pupil or a surface conjugate therewith belonging to the imaging system;
calculating at least one of a topography and a refractive index distribution of at least one surface provided as the correction surface belonging to the optical element, in order to correct the wavefront error;
removing the at least one optical element provided with the correction surface from the imaging system;
locally resolving processing of the at least one correction surface, in order to produce at least one of the calculated topography and the refractive index distribution of the correction surface; and
installing the optical element having the processed correction surface in the predetermined position of the optical element in the imaging system.

25. A method of producing an optical imaging system, which has a plurality of optical elements, comprising:
assembling the imaging system with the optical elements substantially arranged in predetermined positions;
measuring the imaging system with locally resolving determination of the wave-front in the exit pupil or a surface conjugate therewith belonging to the imaging system, for the locally resolving determination of wavefront errors;
wherein the measuring of the imaging system is performed interferometrically, and whereby immediate determination of light path deviations via the exit pupil or a surface conjugate therewith belonging to the imaging system is permitted;

selecting at least one surface provided as a correction surface on at least one of the optical elements, the correction surface being selected such that the correction surface is arranged in the surface of the exit pupil or an surface conjugate therewith belonging to the imaging system;

mounting the optical element having the correction surface in a separate mount;

calculating at least one of a topography and a refractive index distribution of at least one surface provided as the correction surface belonging to the optical element, in order to correct the wavefront error;

removing the at least one optical element provided with a correction surface with the mount from the imaging system;

locally resolving processing of the at least one correction surface of the optical element held in the mount, in order to produce at least one of the calculated topography and refractive index distribution of the correction surface;

installing the optical element having the processed correction surface and held in the mount in the predetermined position of the optical element in the imaging system.

26. The method according to claim 1, further comprising:
calculating an arithmetic mean value of wavefront errors for a number of field points; and
calculating at least one of a topography and a refractive index distribution of the correction surface such that the arithmetic mean value is reduced.

27. The method according to claim 1, further comprising:
calculating a quadratic mean value of wavefront errors for a number of field points; and
calculating at least one of a topography and a refractive index distribution of the correction surface such that the quadratic mean value is reduced.

28. The method according to claim 1, further comprising:
calculating wavefront errors for a number of individual field points to evaluate a maximum value of the wavefront errors;
calculating at least one of a topography and a refractive index distribution of the correction surface such that a maximum value of the wavefront errors corresponding to a worst field point does not exceed a limiting value.

29. The method according to claim 1, further comprising:
defining an optimization target for calculating at least one of a topography and a refractive index distribution of the correction surface;
defining an optimization variable;
defining a calculation mode for calculating the optimization target from the optimization variable, and
calculating at least one of a topography and a refractive index distribution of the correction surface such that the optimization target is optimized;
wherein the optimization variable is chosen from the group consisting of:
an individual Zernike coefficient;
a linear combination of at least two Zernike coefficients;
a residual wavefront error following a filtering of spatial frequencies; and
a wavefront after processing;
wherein the calculation mode for calculating the optimization target is chosen from the group consisting of:
calculating an arithmetic mean value;
calculating a weighted mean value;
calculating a quadratic mean value;
calculating a value for a worst field point; and
calculating a linear combination of at least two of: calculating an arithmetic mean
value; calculating a weighted mean value; calculating a quadratic mean
value; and calculating a value for a worst field point; and
wherein the optimization target is defined for one of an individual wavefront originating from an individual field point and a plurality of wavefronts originating from a plurality of individual field points.

30. The method according to claim 1, wherein the operation of selecting at least one surface provided as a correction surface on at least one of the optical elements is performed prior to assembling the imaging system with the optical elements substantially arranged in predefined positions.

* * * * *